(12) United States Patent
Gao et al.

(10) Patent No.: US 10,727,133 B2
(45) Date of Patent: Jul. 28, 2020

(54) METHOD OF FORMING GATE STRUCTURE WITH UNDERCUT REGION AND RESULTING DEVICE

(71) Applicant: GLOBALFOUNDRIES Inc., Grand Cayman (KY)

(72) Inventors: Qun Gao, Clifton Park, NY (US); Balaji Kannan, Clifton Park, NY (US); Shesh Mani Pandey, Saratoga Springs, NY (US); Haiting Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/134,708

(22) Filed: Sep. 18, 2018

(65) Prior Publication Data

US 2020/0091005 A1 Mar. 19, 2020

(51) Int. Cl.
*H01L 29/66* (2006.01)
*H01L 21/8234* (2006.01)
*H01L 27/088* (2006.01)

(52) U.S. Cl.
CPC ......... *H01L 21/823431* (2013.01); *H01L 21/823418* (2013.01); *H01L 21/823481* (2013.01); *H01L 27/0886* (2013.01); *H01L 29/66545* (2013.01)

(58) Field of Classification Search
CPC ............... H01L 29/66545; H01L 29/0649
See application file for complete search history.

(56) References Cited

U.S. PATENT DOCUMENTS

| | | | |
|---|---|---|---|
| 8,569,152 B1 | 10/2013 | Basker et al. | |
| 8,796,759 B2 | 8/2014 | Perng et al. | |
| 9,324,710 B2 | 4/2016 | Leobandung | |
| 9,786,662 B1* | 10/2017 | Lin | H01L 27/0886 |
| 10,177,240 B2* | 1/2019 | Greene | H01L 29/7856 |
| 2011/0147839 A1* | 6/2011 | Yagishita | H01L 21/823431 257/347 |
| 2015/0243651 A1 | 8/2015 | Leobandung | |
| 2017/0069759 A1* | 3/2017 | Zang | H01L 29/7853 |
| 2017/0084463 A1 | 3/2017 | Grenne et al. | |
| 2017/0084723 A1 | 3/2017 | Grenne et al. | |
| 2017/0148682 A1 | 5/2017 | Basker et al. | |

* cited by examiner

*Primary Examiner* — Hoa B Trinh
(74) *Attorney, Agent, or Firm* — Amerson Law Firm, PLLC

(57) ABSTRACT

A method of forming a gate structure with an undercut region includes, among other things, forming a plurality of fins above a substrate and an isolation structure above the substrate and between the plurality of fins, forming a placeholder gate structure above the plurality of fins in a first region and above the isolation structure in a second region, selectively removing a portion of the placeholder structure in the second region to define an undercut recess, forming a spacer structure adjacent the sacrificial gate structure, forming a dielectric layer adjacent the spacer structure and in the undercut recess, removing remaining portions of the placeholder gate structure to define a gate cavity, and forming a replacement gate structure in the gate cavity.

18 Claims, 9 Drawing Sheets

METHOD OF FORMING GATE STRUCTURE WITH UNDERCUT REGION AND RESULTING DEVICE

BACKGROUND

1. Field of the Disclosure

The present disclosure generally relates to the fabrication of integrated circuits, and, more particularly, to various methods of forming a gate structure with an undercut region and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate structure positioned above and between the source/drain regions. Upon application of an appropriate control voltage to the gate structure, a conductive channel region forms between the drain region and the source region.

Figure 1:
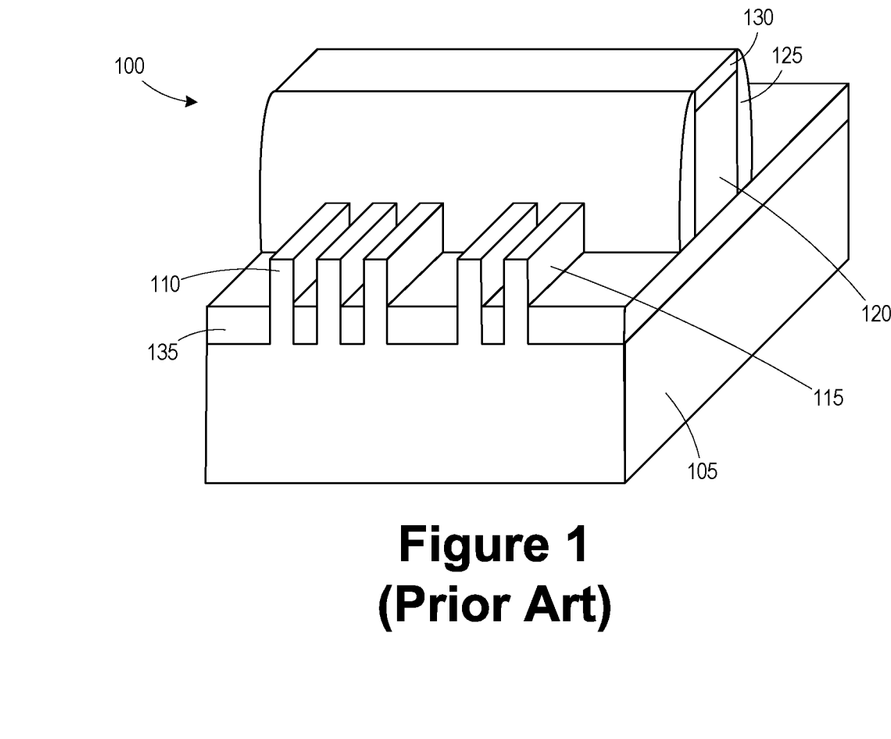
FIG. 1 is a perspective view of one illustrative embodiment of a prior art semiconductor product.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125 and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

In an integrated circuit device, there are different performance requirements for different functional blocks or regions of the device. One technique for improving performance in a transistor device involves reducing the capacitance of the gate structure. The capacitance between the gate structure and the adjacent source/drain contacts contributes significantly to the effective capacitance. Due to the density of the structure and the close proximity of these elements, it is difficult to reduce this capacitance.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a gate structure with an undercut region and the resulting devices. One illustrative method includes, among other things, forming a plurality of fins above a substrate and an isolation structure above the substrate and between the plurality of fins, forming a placeholder gate structure above the plurality of fins in a first region and above the isolation structure in a second region, selectively removing a portion of the placeholder structure in the second region to define an undercut recess, forming a spacer structure adjacent the sacrificial gate structure, forming a dielectric layer adjacent the spacer structure and in the undercut recess, removing remaining portions of the placeholder gate structure to define a gate cavity, and forming a replacement gate structure in the gate cavity.

Another illustrative method includes, among other things, forming a plurality of fins above a substrate and an isolation structure above the substrate and between the plurality of fins and forming a placeholder gate structure above the plurality of fins in a first region and above the isolation structure in a second region, wherein the placeholder gate structure comprises a gate insulation layer, a first placeholder layer, and a second placeholder layer formed above the first placeholder layer and comprising a material different than the first placeholder layer. The method further includes forming a mask layer covering a first portion of the placeholder gate structure in the first region and exposing a second portion of the placeholder gate structure in the second region, selectively removing an exposed portion of the first placeholder layer in the second region to define an undercut recess beneath the second placeholder layer in the second region, forming a spacer structure adjacent the sacrificial gate structure, forming a dielectric layer adjacent the spacer structure and in the undercut recess, removing remaining portions of the placeholder gate structure to define a gate cavity, and forming a replacement gate structure in the gate cavity.

One illustrative device includes, among other things, a plurality of fins positioned above a substrate, an isolation structure positioned above the substrate and between the plurality of fins, and a gate structure positioned above the plurality of fins and the substrate, wherein the gate structure has a first vertical thickness in a first region and above the plurality of fins and a second vertical thickness above the isolation structure less than the first vertical thickness.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a gate structure with an undercut region and the resulting devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2H depict one illustrative method disclosed for forming a gate structure with an undercut region and the resulting devices. The illustrative product 200 includes a plurality of fins 205 formed in a semiconductor substrate 210.

Figure 2A:
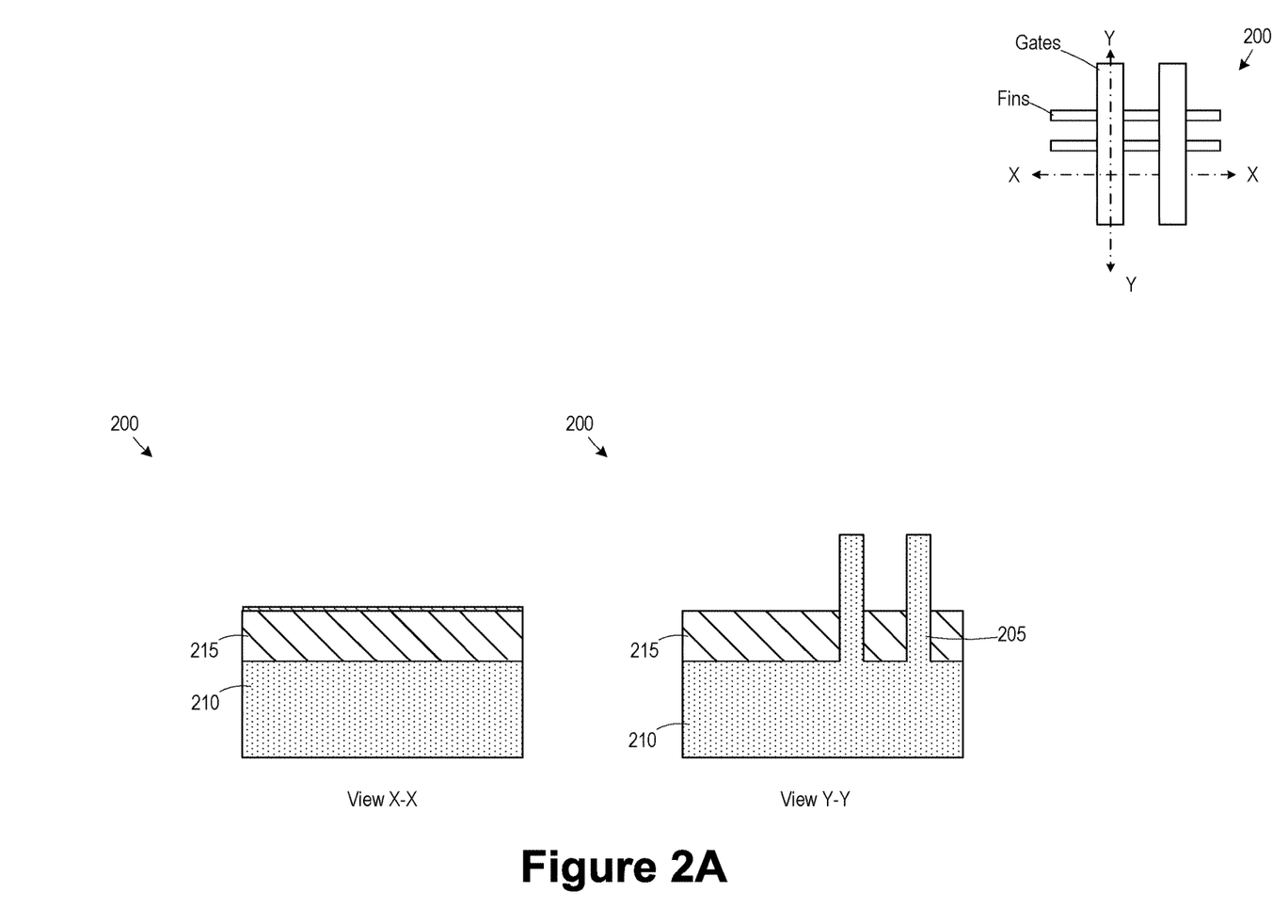
FIGS. 2A-2H depict illustrative methods of forming a gate structure with an undercut region and the resulting devices.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers.

FIG. 2A depicts the product 200 at a point in fabrication wherein several process operations have been performed. First, the plurality of fins 205 were formed by etching trenches in the substrate 210 using a patterned hard mask. In general, the fins 205 define an active region for forming devices, such as FinFET transistors. An isolation structure (e.g., STI) 215 was formed by depositing a dielectric layer (e.g., silicon dioxide) between the fins 205 and recessing the dielectric layer. The hard mask was removed.

FIGS. 2A-2H also include a simplistic plan view of the product 200 (in the upper right corner of each sheet) that depicts the location where various cross-sectional views depicted in the following drawings will be taken. More specifically, the cross-sectional view "X-X" is taken parallel to the fin 205 along its long axis, and the cross-sectional view "Y-Y" is taken along the long axis of the gate structures. Not all features of the product 200 are illustrated in the plan view.

Figure 2B:
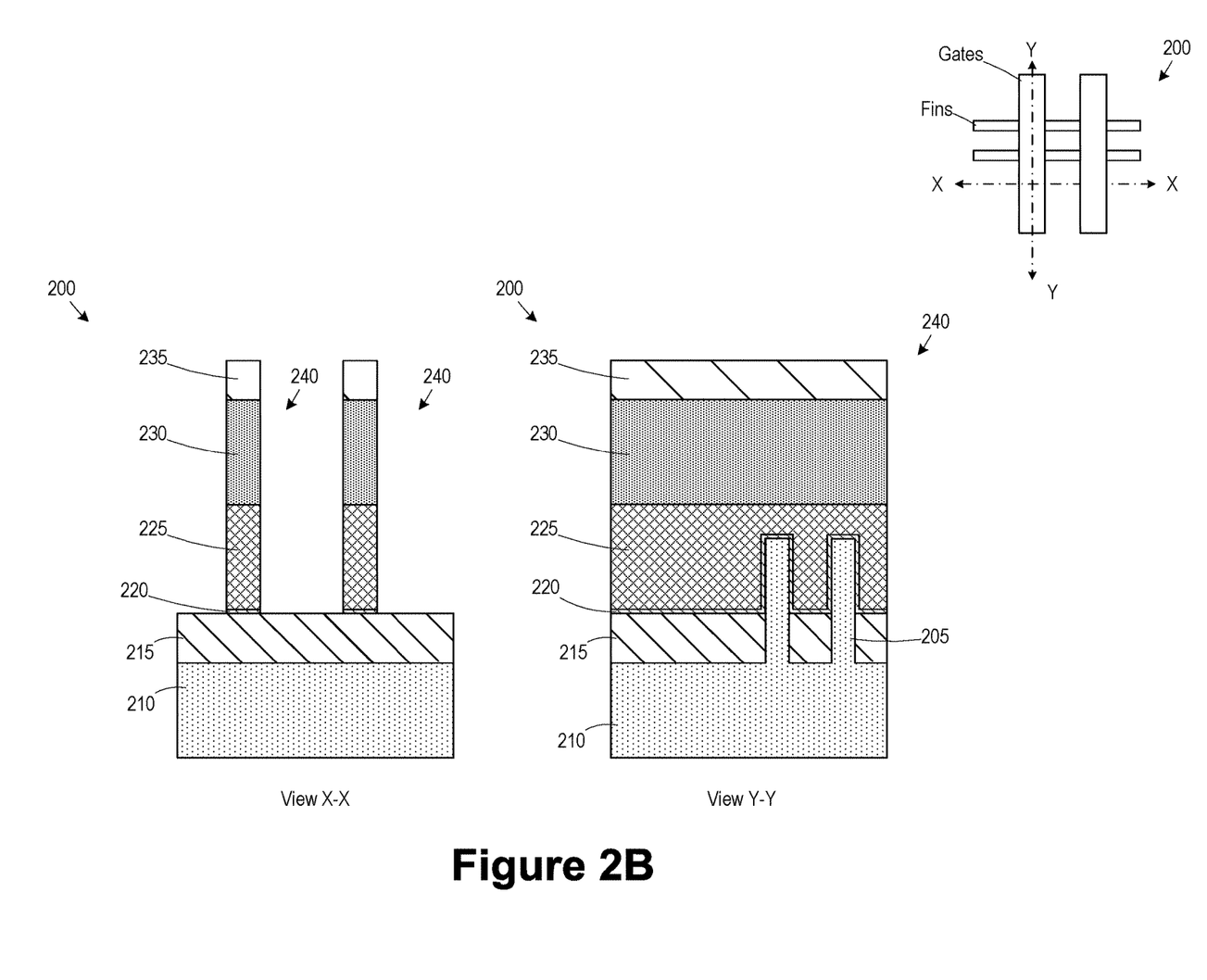

FIG. 2B illustrates the product 200 after several processes were performed. Several deposition processes were performed to define a gate insulation layer 220, a first placeholder layer 225 (e.g., SiGe), a second placeholder layer 230 (e.g., polysilicon or amorphous silicon), and a hard mask layer 235 above the fins 205. A patterning process was performed to pattern the hard mask layer 235 corresponding to the pattern of gate structures to be formed. An anisotropic etch process was performed using the patterned hard mask layer 235 to etch the placeholder layers 225, 230 and the gate insulation layer 220 to define placeholder gate structures 240 (i.e., defined by the placeholder layers 225, 230 and the gate insulation layer 220).

Figure 2C:
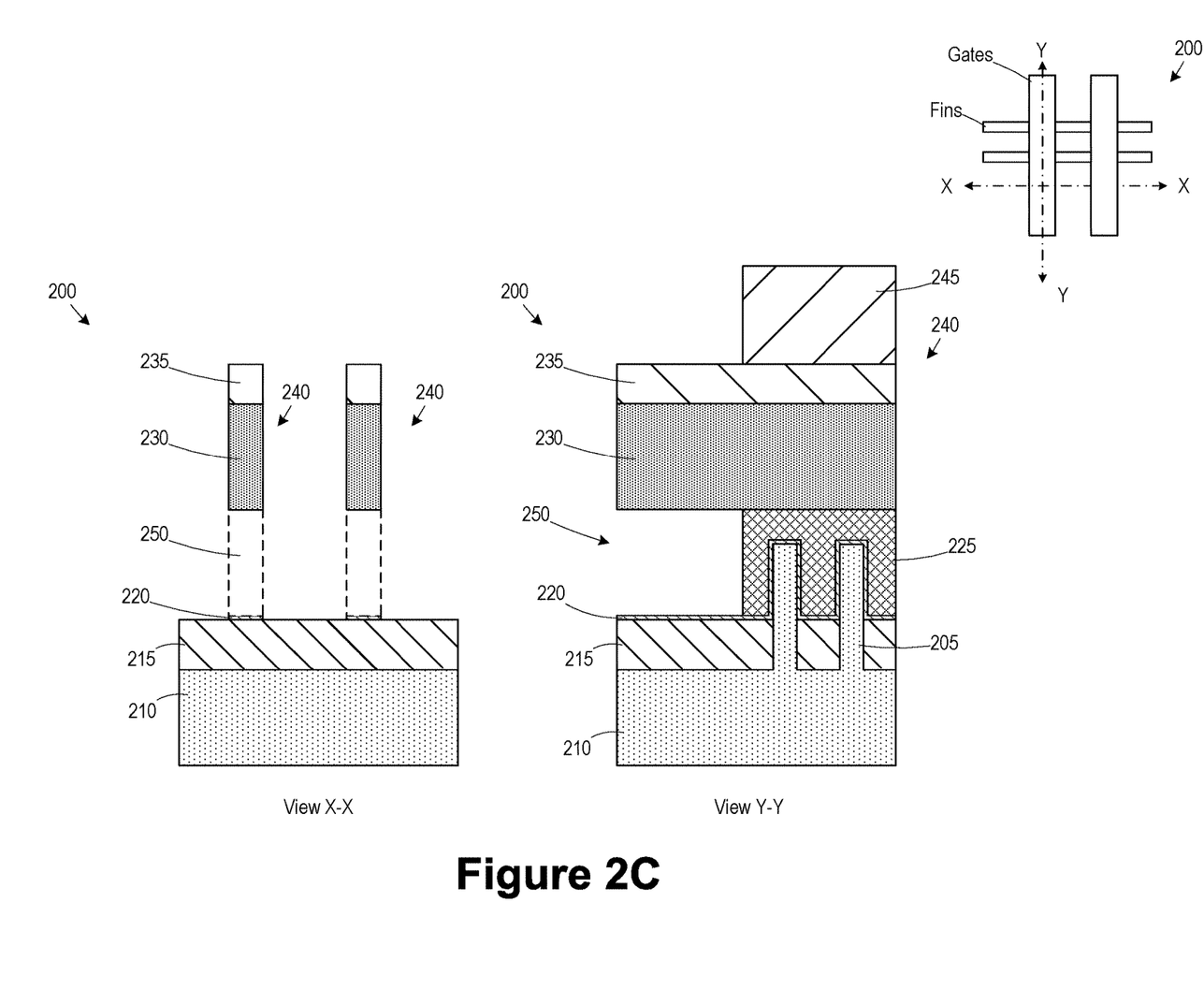

FIG. 2C illustrates the product 200 after a mask layer 245 (e.g., photoresist stack) was formed above the placeholder gate structures 240 and patterned to cover a region of the placeholder gate structures 240 positioned above the fins 205. A selective etch process was performed to remove exposed portions of the first placeholder layer 225 thereby defining undercut recesses 250.

Figure 2D:
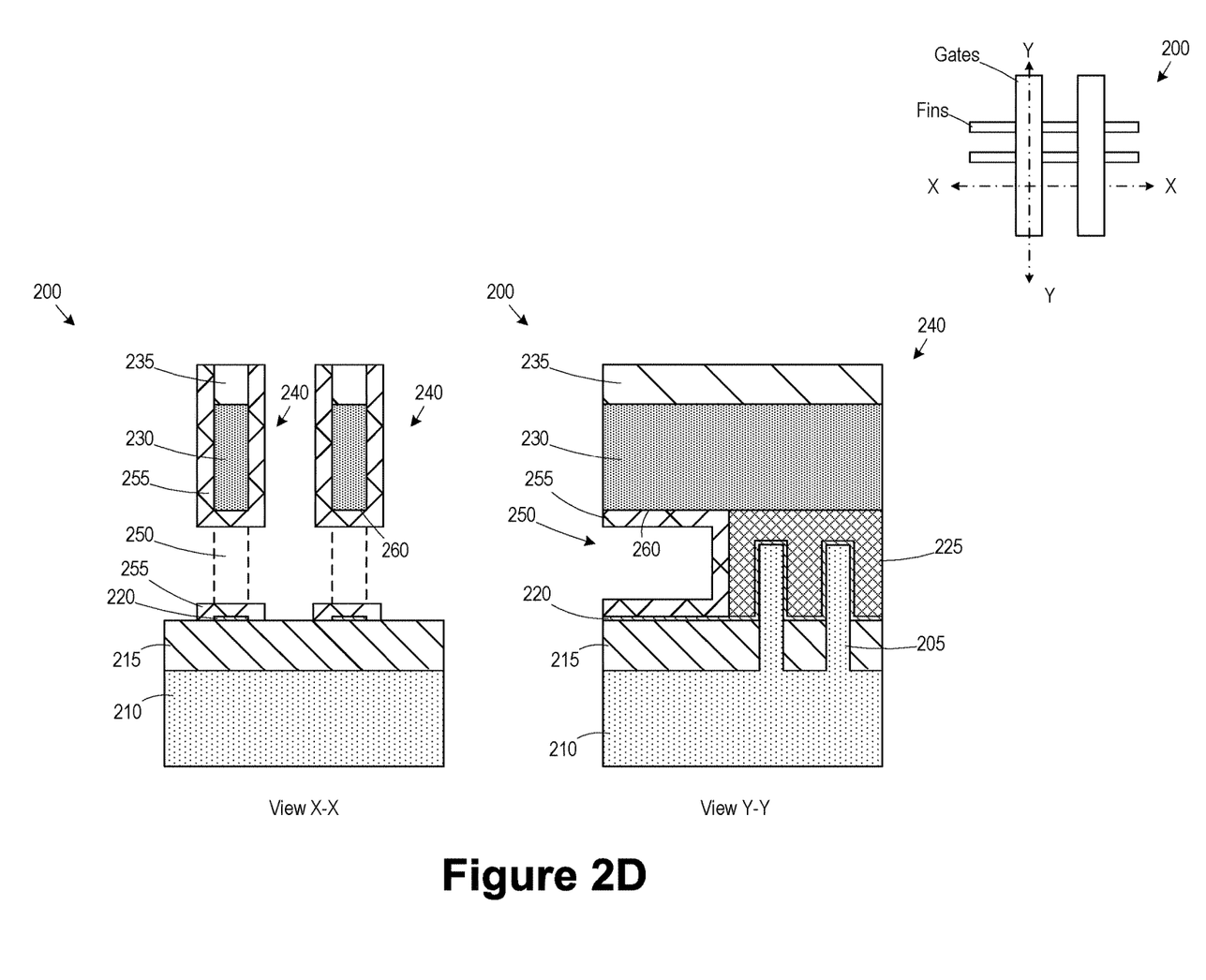

FIG. 2D illustrates the product 200 after a strip process was performed to remove the mask layer 245. A deposition process was performed to form a spacer layer (e.g., silicon nitride) above the placeholder gate structures 240, and an anisotropic etch process was performed to remove horizontal portions of the spacer layer to define spacers 255. Because the second placeholder layer 230 shelters the undercut recesses 250, the spacer 255 lines the undercut recesses 250. The spacer 255 also covers the lower surface 260 of the second placeholder layer 230, thereby defining a U-shaped vertical cross-section around the second placeholder layer 230.

Figure 2E:
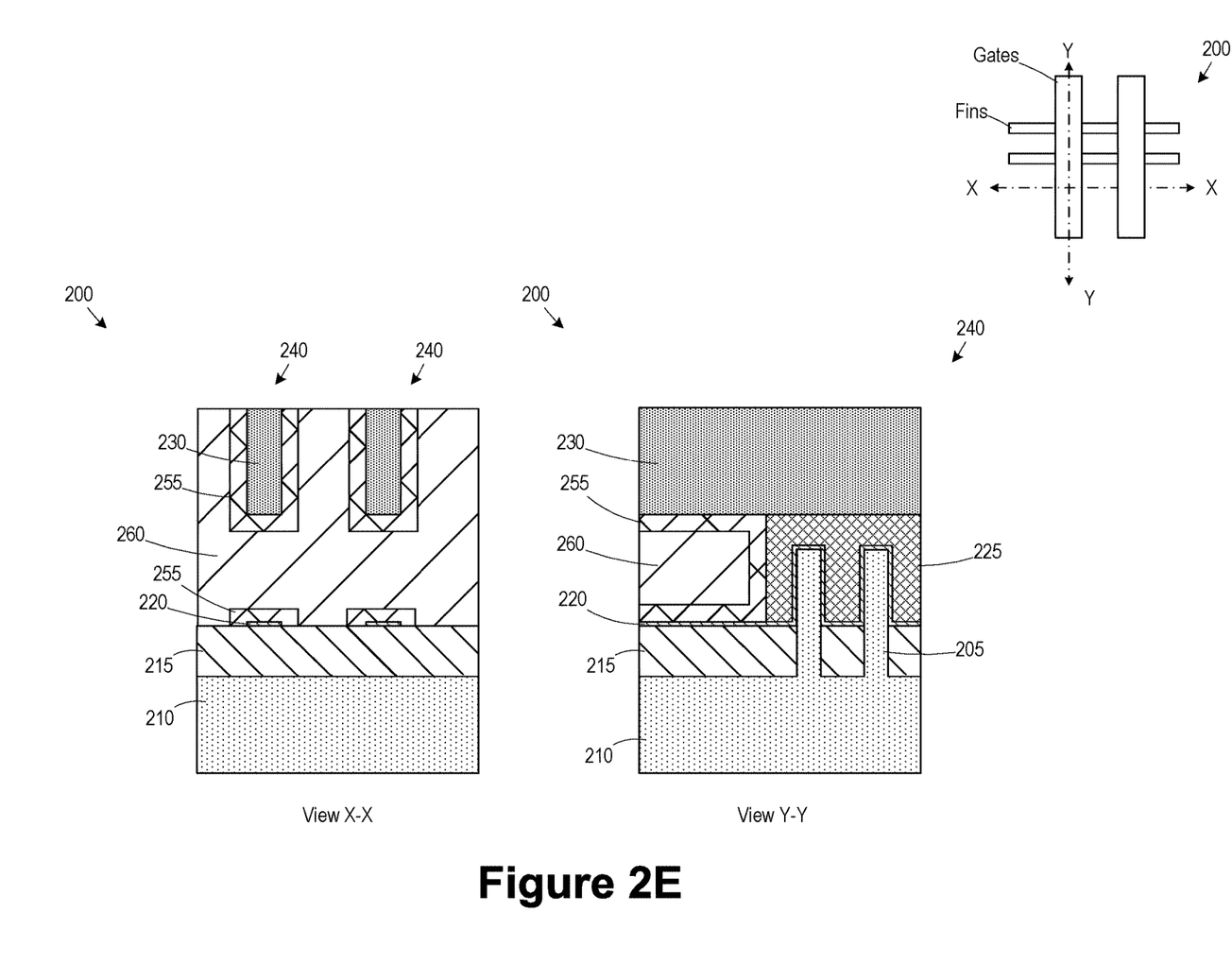

FIG. 2E illustrates the product 200 after a deposition process was performed to form a dielectric layer 260 (e.g., silicon dioxide, a low-k dielectric material, or an ultra-low-k dielectric material) between the placeholder gate structures 240 and in the undercut recesses 250 and planarized to remove the hard mask layer 235, reduce the height of the spacers 255, and expose the second placeholder layer 230.

Figure 2F:
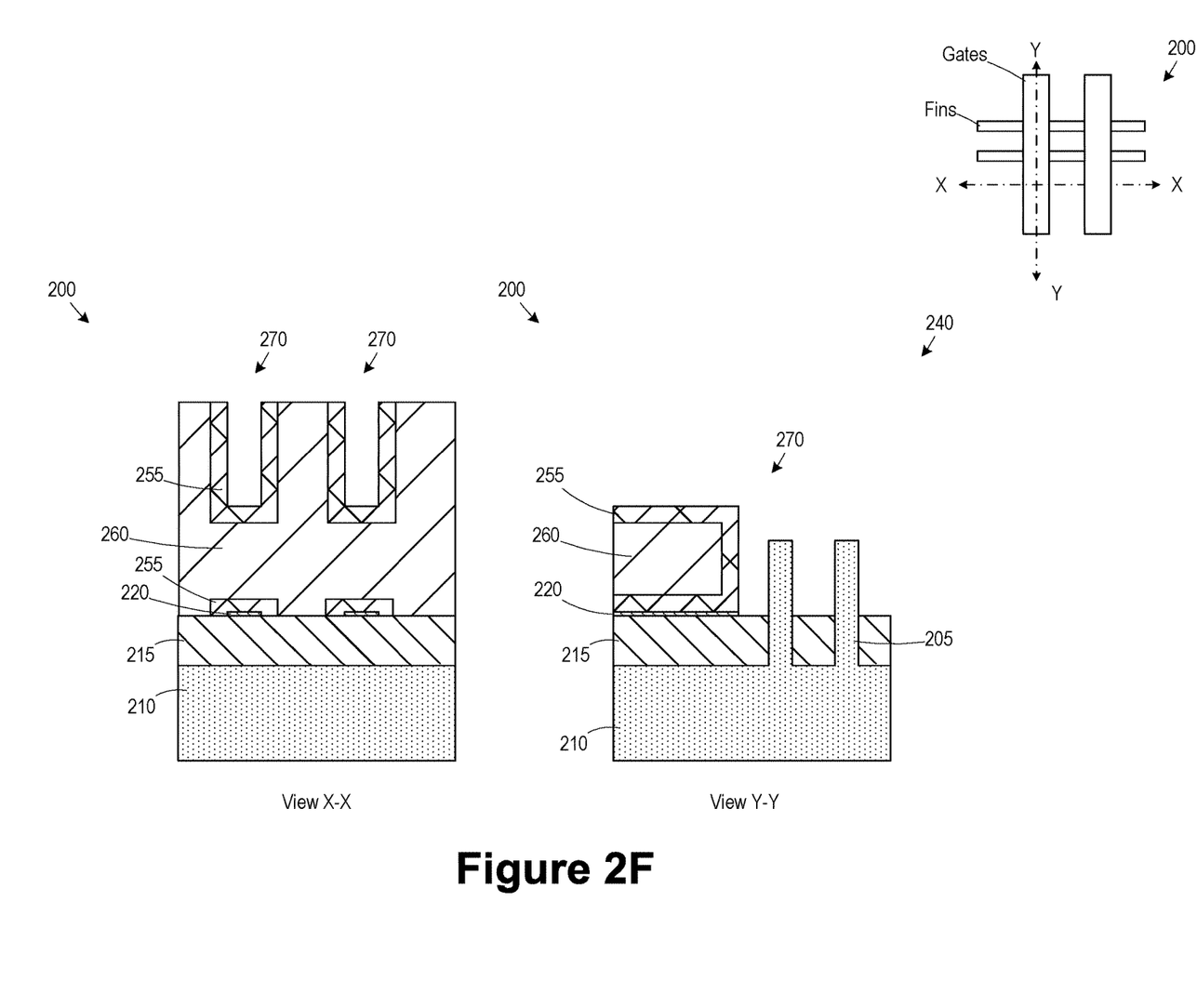

FIG. 2F illustrates the product 200 after one or more etch processes were performed to remove the first and second placeholder layers 225, 230 and the exposed portion of the gate insulation layer 220, thereby exposing the fins 205 in the channel regions of the device and defining a plurality of gate cavities 270.

Figure 2G:
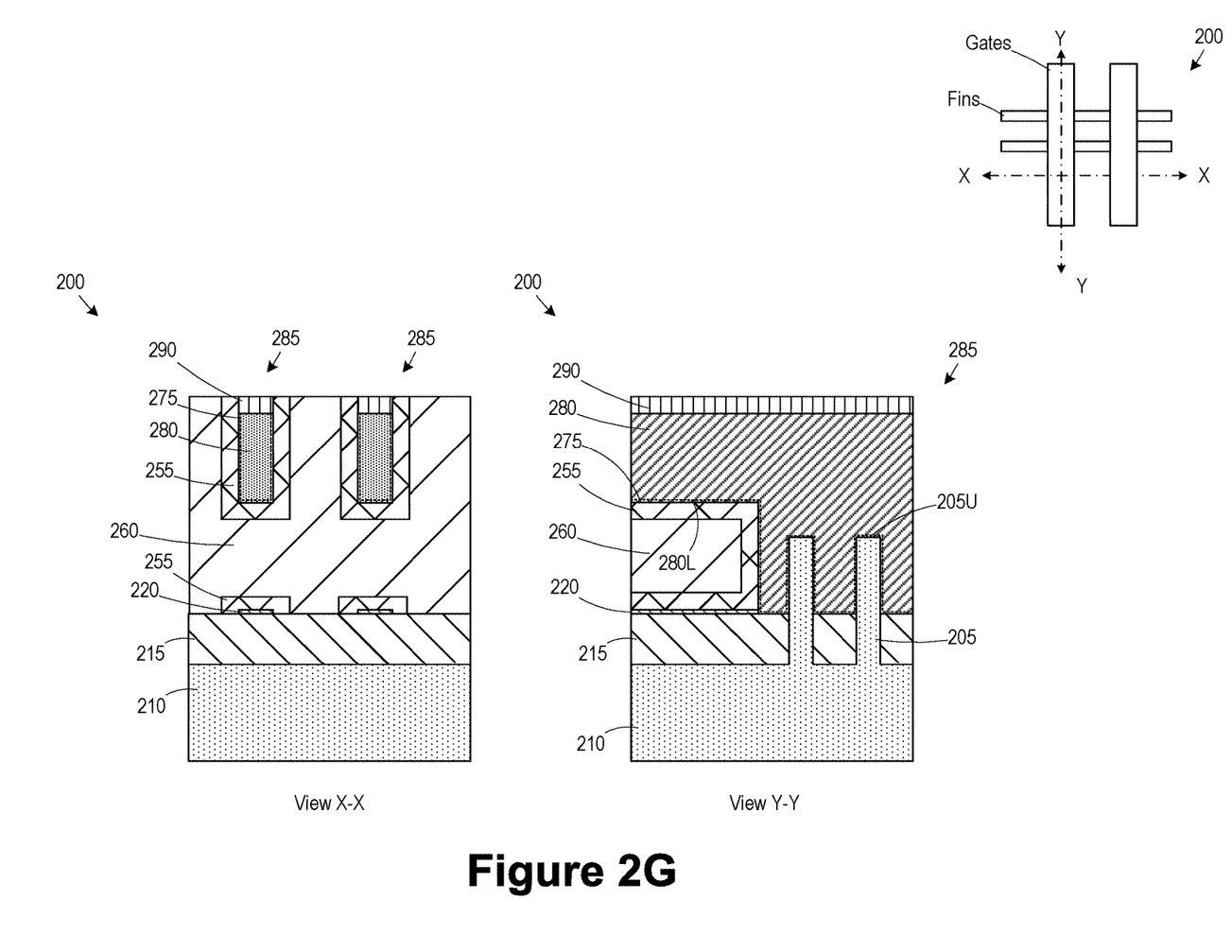

FIG. 2G illustrates the product 200 after a plurality of processes were performed. One or more deposition processes were performed to form a gate insulation layer 275, and a gate electrode material 280 (e.g., may include multiple layers, such as a barrier layer, a work function material layer, a seed layer, a fill layer, etc.) to define replacement gate structures 285. The material of the replacement gate structures 285 may be planarized and recessed, and a cap layer 290 may be formed. A lowermost surface 280L of the gate electrode material 280 is positioned above an uppermost surface 205U of the fins 205.

Figure 2H:
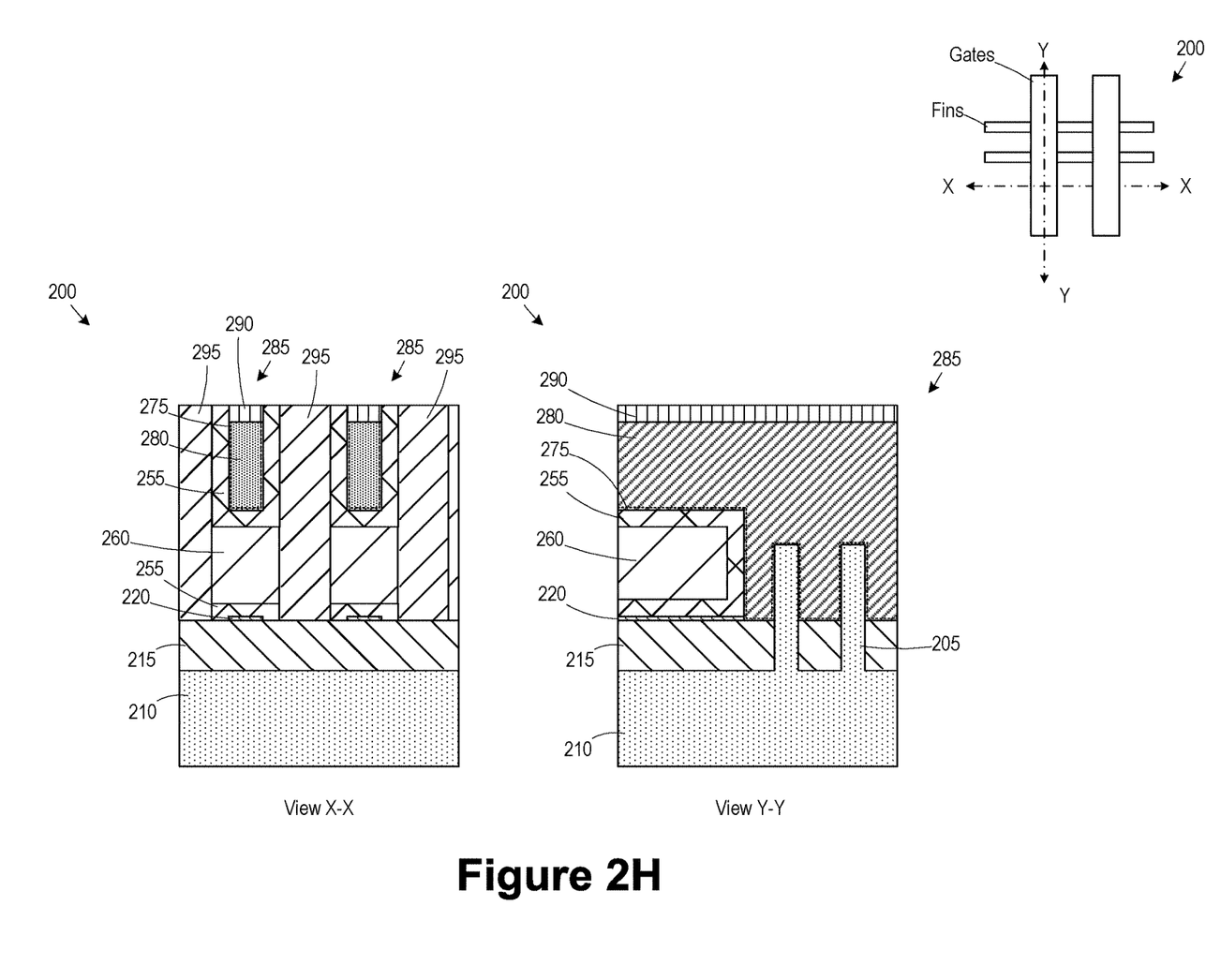

FIG. 2H illustrates the product 200 after several processes were performed. Openings were formed in the dielectric layer 260 between the gate structures to expose underlying source/drain regions (not visible in the views shown). Source/drain contacts 295 (e.g., silicide) were formed in the openings.

Additional process steps may be formed to complete fabrication of the product 200, such as the forming of various metallization layers including interconnects, such as contacts, vias, and lines for contacting the various portions of the product, such as the source/drain regions, gate structures, etc. The process flow illustrated above has several advantages. Because the lower portion of the sacrificial gate structure 240 was removed by removing a portion of the first placeholder layer 225 and replaced with the dielectric layer 260 prior to forming the replacement gate structures 285, the capacitance between the replacement gate structures 285 and the source/drain contacts 295 is reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A device, comprising:
    a plurality of fins positioned above a first region of a substrate;
    an isolation structure positioned above a second region of the substrate, wherein the isolation structure is not positioned above the plurality of fins; and
    a gate structure positioned above the plurality of fins and above the isolation structure, wherein a first portion of the gate structure positioned above the isolation structure has a first vertical thickness and a second portion of the gate structure positioned between the plurality of fins has a second vertical thickness, wherein the first vertical thickness is less than the second vertical thickness and wherein, when viewed in a cross-section taken through the first portion of the gate structure in a direction corresponding to a gate width direction of the device, the isolation structure comprises a generally U-shaped insulating liner and a dielectric material positioned within the generally U-shaped insulating liner.

2. The device of claim 1, wherein a lowermost surface of the first portion of the gate structure positioned above the isolation structure is positioned at a level that is above a level of an uppermost surface of at least one of the plurality of fins.

3. The device of claim 1, wherein, when viewed in a cross-section taken through the first portion of the gate structure in a direction corresponding to a gate length direction of the device, the device further comprises a generally U-shaped insulating spacer that is positioned adjacent a bottom surface and opposing side surfaces of the first portion of the gate structure.

4. The device of claim 3, wherein the generally U-shaped insulating spacer is positioned on and in contact with the bottom surface and the opposing side surfaces of the first portion of the gate structure.

5. The device of claim 3, further comprising a dielectric material positioned vertically below the generally U-shaped insulating spacer.

6. The device of claim 1, further comprising first and second source/drain contact structures positioned adjacent first and second side surfaces, respectively, of the isolation structure.

7. The device of claim 5, further comprising first and second source/drain contact structures, wherein the generally U-shaped insulating spacer comprises first and second substantially vertically oriented outer side surfaces and the dielectric material comprises first and second substantially vertically oriented side surfaces, wherein the first source/drain contact structure is positioned adjacent the first side surface of the generally U-shaped insulating spacer and adjacent the first side surface of the dielectric material and wherein the second source/drain contact structure is positioned adjacent the second side surface of the generally U-shaped insulating spacer and adjacent the second side surface of the dielectric material.

8. The device of claim 1, wherein the generally U-shaped insulating liner comprises a substantially vertically oriented portion that is positioned laterally between the dielectric material and one of the plurality of fins.

9. A device, comprising:
    a plurality of fins positioned above a first region of a substrate;

an isolation structure positioned above a second region of the substrate, wherein the isolation structure is not positioned above the plurality of fins; and a gate structure positioned above the plurality of fins and above the isolation structure, wherein a lowermost surface of a first portion of the gate structure positioned above the isolation structure is positioned at a level that is above a level of an uppermost surface of at least one of the plurality of fins and wherein, when viewed in a cross-section taken through the first portion of the gate structure in a direction corresponding to a gate length direction of the device, the device further comprises a generally U-shaped insulating spacer that is positioned adjacent a bottom surface and opposing side surfaces of the first portion of the gate structure.

10. The device of claim 9, wherein the first portion of the gate structure has a first vertical thickness and a second portion of the gate structure positioned above the uppermost surface of said at least one of the plurality of fins has a second vertical thickness, wherein the first vertical thickness is less than the second vertical thickness.

11. The device of claim 9, wherein, when viewed in a cross-section taken through the first portion of the gate structure in a direction corresponding to a gate width direction of the device, the isolation structure comprises a generally U-shaped insulating liner and a dielectric material positioned within the generally U-shaped insulating liner.

12. The device of claim 11, wherein the generally U-shaped insulating liner comprises a substantially vertically oriented portion that is positioned laterally between the dielectric material and one of the plurality of fins.

13. The device of claim 9, further comprising first and second source/drain contact structures positioned adjacent first and second side surfaces, respectively, of the isolation structure.

14. The device of claim 9, further comprising a dielectric material positioned vertically below the generally U-shaped insulating spacer.

15. A device, comprising:
a plurality of fins positioned above a first region of a substrate;
an isolation structure positioned above a second region of the substrate, wherein the isolation structure is not positioned above the plurality of fins;
a gate structure positioned above the plurality of fins and above the isolation structure, wherein a first portion of the gate structure positioned above the isolation structure has a first vertical thickness and a second portion of the gate structure positioned between the plurality of fins has a second vertical thickness, wherein the first vertical thickness is less than the second vertical thickness; and
a generally U-shaped insulating spacer wherein, when viewed in a cross-section taken through the first portion of the gate structure in a direction corresponding to a gate length direction of the device, the generally U-shaped insulating spacer is positioned adjacent a bottom surface and opposing side surfaces of the first portion of the gate structure and wherein, when viewed in a cross-section taken through the first portion of the gate structure in a direction corresponding to a gate width direction of the device, the isolation structure comprises a generally U-shaped insulating liner and a dielectric material positioned within the generally U-shaped insulating liner.

16. The device of claim 15, wherein a lowermost surface of the first portion of the gate structure positioned above the isolation structure is positioned at a level that is above a level of an uppermost surface of at least one of the plurality of fins.

17. The device of claim 15, wherein the generally U-shaped insulating liner comprises a substantially vertically oriented portion that is positioned laterally between the dielectric material and one of the plurality of fins.

18. The device of claim 15, further comprising first and second source/drain contact structures positioned adjacent first and second side surfaces, respectively, of the isolation structure.

\* \* \* \* \*